(12) United States Patent
Wang et al.

(10) Patent No.: US 9,000,407 B2
(45) Date of Patent: Apr. 7, 2015

(54) RERAM MATERIALS STACK FOR LOW-OPERATING-POWER AND HIGH-DENSITY APPLICATIONS

(71) Applicants: Intermolecular Inc., San Jose, CA (US); Kabushiki Kaisha Toshiba, Tokyo (JP); SanDisk 3D LLC, Milpitas, CA (US)

(72) Inventors: Yun Wang, San Jose, CA (US); Tony P. Chiang, Campbell, CA (US); Dipankar Pramanik, Saratoga, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 3 days.

(21) Appl. No.: 13/903,656

(22) Filed: May 28, 2013

(65) Prior Publication Data

US 2014/0353566 A1    Dec. 4, 2014

(51) Int. Cl.
*H01L 45/00*    (2006.01)

(52) U.S. Cl.
CPC .......... *H01L 45/146* (2013.01); *H01L 45/1616* (2013.01)

(58) Field of Classification Search
CPC ... H01L 45/146; H01L 45/1233; H01L 45/08; H01L 27/2463; H01L 45/1253; H01L 45/145; H01L 45/12; H01L 45/04; H01L 21/02178; H01L 21/02181; H01L 21/02186; H01L 21/02189; H01L 21/02192; H01L 29/8615; H01L 51/5275; F21S 8/06; F21V 17/12; F21V 3/0436; F21Y 2105/008; F21K 9/135; F21K 9/52; G11C 13/0004; G11C 13/0007; G11C 13/0069

USPC .......................................................... 365/148
See application file for complete search history.

(56) References Cited

U.S. PATENT DOCUMENTS 6,872,963 B2    3/2005  Kostylev et al.
6,906,939 B2    6/2005  Rinerson et al.
(Continued)

FOREIGN PATENT DOCUMENTS

WO    WO-2007-004843 A1    1/2007

OTHER PUBLICATIONS

Lee, M., et al.; A Fast HighEndurance and Scalable NonVolatile Memory Device Made from Asymmetric Ta2O5TaO2x Bilayer Structures; Jul. 10, 2007; Macmillan Publishers Limited; Nature Materials 6 pages.

(Continued)

*Primary Examiner* — Whitney T Moore

(57) ABSTRACT

A switching element for resistive-switching memory (ReRAM) provides a controllable, consistent filament break-point at an abrupt structural discontinuity between a layer of high-k high-ionicity variable-resistance (VR) material and a layer of low-k low-ionicity VR material. The high-ionicity layer may be crystalline and the low-ionicity layer may be amorphous. The consistent break-point and characteristics of the low-ionicity layer facilitate lower-power operation. The defects (e.g., oxygen or nitrogen vacancies) that constitute the filament originate either in the high-ionicity VR layer or in a source electrode. The electrode nearest to the low-ionicity layer may be intrinsically inert or may be rendered effectively inert. Some electrodes are rendered effectively inert by the creation of the low-ionicity layer over the electrode.

16 Claims, 3 Drawing Sheets

(56) References Cited

U.S. PATENT DOCUMENTS

| | | |
|---|---|---|
| 6,965,137 B2 | 11/2005 | Kinney et al. |
| 7,417,271 B2 | 8/2008 | Genrikh et al. |
| 7,420,198 B2 | 9/2008 | Baek et al. |
| 7,535,035 B2 | 5/2009 | Baek et al. |
| 7,718,988 B2 | 5/2010 | Lee |
| 7,897,453 B2 | 3/2011 | Chen et al. |
| 8,116,116 B2 | 2/2012 | Hwang |
| 2010/0243983 A1* | 9/2010 | Chiang et al. ............ 257/4 |
| 2011/0049464 A1* | 3/2011 | Lee et al. ............ 257/4 |
| 2012/0012807 A1 | 1/2012 | Yamaguchi |
| 2012/0074374 A1* | 3/2012 | Jo ............ 257/4 |
| 2012/0305880 A1* | 12/2012 | Zhang et al. ............ 257/4 |

OTHER PUBLICATIONS

Netzer, F.; Interfacial Oxide Layers at the MetalOxide Phase Boundary; Jan. 1, 2002; World Scientific Publishing Company; Surface Review and Letters vol. 9 Nos. 3 and 4 pp. 15531563.

Lee et al.; MultiLevel Switching of TripleLayered TaOx RRAM with Excellent Reliability for Storage Class Memory; Jan. 1, 2012; 2012 Symposium on VLSI Technology Digest of Technical Papers.

Wei et al.; Demonstration of HighDensity ReRAM Ensuring 10year Retention at 85 C based on a Newly Developed Reliability Model; Jan. 1, 2011; IEEE IEDM.

\* cited by examiner

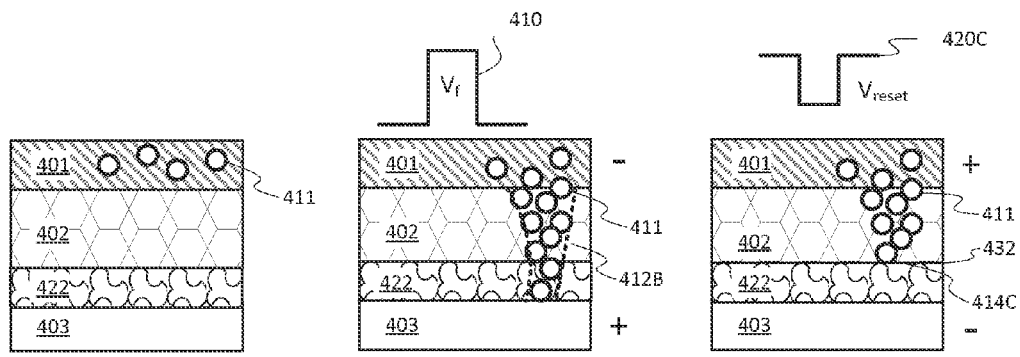
*FIG. 4A*  *FIG. 4B*  *FIG. 4C*
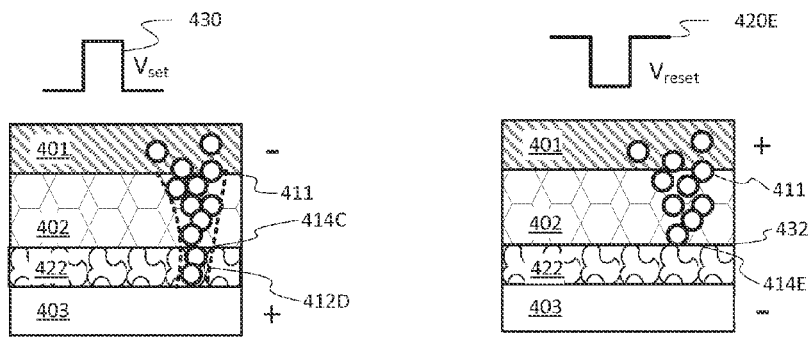
*FIG. 4D*  *FIG. 4E*
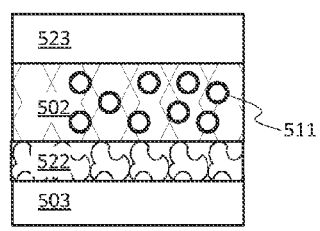
*FIG. 5*

RERAM MATERIALS STACK FOR LOW-OPERATING-POWER AND HIGH-DENSITY APPLICATIONS

BACKGROUND

Related fields include semiconductor devices and their fabrication; in particular, thin-film components included in individual cells of non-volatile memory based on resistive switching (ReRAM).

Nonvolatile memory elements are used in computers and other devices requiring persistent data storage (e.g., cameras, music players). Some traditional nonvolatile memory technologies (e.g., EEPROM, NAND flash) have proven difficult to scale down to smaller or higher-density configurations. Therefore, a need has developed for alternative nonvolatile memory technologies that can be scaled down successfully in terms of performance, reliability, and cost.

In resistive-switching-based nonvolatile memory, each individual cell includes a resistor that is bistable; it can be put into either of two states (low-resistance or high-resistance), and will stay in that state until receiving the type of input that changes it to the other state. The state of the bistable memory cell represents a bit value (e.g., the low-resistance state may represent "1" and the high-resistance state may represent "0"). The cell is thus "written" to by changing its resistance value. The cell is "read" by measuring its resistance in a way that does not change it. Ideally, write and read operations should require as little power as possible, both to conserve energy and to avoid generating unwanted heat.

FIG. 1A is a perspective view of an example memory array. Such a memory array may be part of a larger device, such as a system-on-a-chip. Multiple memory arrays may be stacked in a vertical fashion to make multilayer memory array structures. The memory array includes multiple ReRAM cells 100. Each cell 100 includes a switching stack 112 formed from multiple thin-film material layers 114. Material layers 114 typically include one or more bistable variable resistance (VR) layers between two or more electrode layers. Electrical signals flow from one electrode to the other through the VR layer(s) to read or write the cell.

Connections 102 and connections 118, sometimes called "bit-lines" and "word-lines" respectively, interconnect the cells in the array and connect the array to other circuit elements, such as power sources and read/write circuitry (not shown). In some arrays, connections 102 and connections 118 serve as the electrodes for the ReRAM cells; in others, the connections are connected to separately-formed electrodes in the material layers of each cell 100.

FIG. 1B is a simplified electrical schematic of the example memory array showing the ReRAM cells 100 connected by bit-lines 102 and word-lines 118. Each cell 100 can be read or written individually through the word-line 118 and bit line 102 that intersect at that particular cell 100. In some memory arrays, a ReRAM cell 100 may include a current-steering element 116 (e.g., a diode, or some other element that similarly constrains a direction of current flow) connected in series with switching stack. Current-steering element 116 constrains current to flow through only those ReRAM cells 100 for which the intersecting word-lines 118 and bit-lines 102 are selected. The current-steering elements, if present, are also fabricated from thin films and are included in material layers 114 in FIG. 1A.

FIG. 1C is an example "I-V curve" of measured current I (on a logarithmic scale) plotted against applied voltage V for ReRAM cell 100. The bistable VR layer(s) in switching stack 112 may be placed either of two stable states: a low-resistance state ($R=R_L$) or a high-resistance state ($R=R_H$). Each state yields a different I-V curve: curve 120 is produced when $R=R_L$ and curve 124 is produced when $R=R_H$.

A write operation may either "set" (126) the resistance of switching stack 112 from its high state to its low state or "reset" (128) the resistance from its low state to its high state. A "set" switching pulse of voltage $V_{set}$ applied to ReRAM cell 100 induces a high-to-low resistance transition, which in turn causes the current flowing through the cell to drop from $I(V_{set},R_H)$ to $I(V_{set},R_L)$, following arrow 126 on the graph. Similarly, a "reset" switching pulse of voltage $V_{reset}$ applied to ReRAM cell 100 induces a low-to-high resistance transition, which in turn causes the current flowing through the cell to drop from $I(V_{reset},R_L)$ to $I(V_{reset},R_H)$, following arrow 128. This example uses bipolar switching; the set and reset pulses are of opposite polarity. Some ReRAM designs use unipolar switching, with set and reset pulses of the same polarity.

To read the resistance state of ReRAM cell 100, a voltage pulse may be applied and the resulting current (which depends on the cell's resistance state) may be measured. A read operation senses the resistance state of ReRAM cell 100 without changing it. Accordingly, the magnitude $V_{read}$ of a read pulse is significantly smaller than the write voltages $V_{set}$ and $V_{reset}$ (e.g., a read pulse may only be ⅛-⅓ of the voltage of a write pulse). When a $V_{read}$ pulse is applied to ReRAM cell 100, the measured current will either be $I(V_{read},R_H)$ or $I(V_{read},R_L)$ depending on the cell's resistance state. If the logic value "0" is assigned to the high-resistance state and the logic value "1" is assigned to the low-resistance state, then a response of $I(V_{read},R_H)$ to a $V_{read}$ pulse will be interpreted as a stored "0" and a response of $I(V_{read}, R_L)$ will be interpreted as a stored "1." In this example, $V_{read}$ is positive, but a negative $V_{read}$ of sufficiently small magnitude could alternatively be used.

According to working hypotheses that seem to fit empirical data so far, in at least some types of ReRAM the resistance change in the VR layer of a cell is not homogeneous throughout the layer. In the low-resistance state, charge carriers (e.g., oxygen or nitrogen vacancies) in the VR layer(s) are assembled into a "filament" traversing the entire VR layer. The filament provides a localized lower-resistance path for current. In the high-resistance state, the filament is incomplete or absent. This means that the set pulse must create or assemble the filament and the reset pulse must break, disperse, or destroy it.

To predispose the VR layer to create a filament, a "forming voltage" pulse, with a magnitude much larger than a set or reset pulse, may be applied to newly fabricated ReRAM cells. The forming pulse creates defects (e.g., oxygen vacancies) in the VR layer(s) or at the interface of a VR layer and an electrode made of an oxidizable material (a "source electrode" acting as a cathode), and drives them through the stack to the other electrode (often made of a noble or inert material) that acts as an anode.

FIGS. 2A-2F conceptually illustrate filament behavior in a simple ReRAM switching stack with a single metal-oxide ("MeO$_x$") VR layer. In FIG. 2A, the stack of source electrode 201, VR layer 202, and inert electrode 203 has just been fabricated. VR 202 is typically crystalline; many of the high-k transition-metal oxides (e.g. HfO$_x$, TiO$_x$) crystallize after the annealing steps required to fabricate other layers (e.g., the 750 C anneal required in the fabrication of some current-steering elements). At this point, the as-fabricated resistance $R_0$ of VR layer 202 is at least as high as its operating high-resistance state $R_H$ will be; in many cases, higher.

In FIG. 2B, forming voltage 210 has just been applied between electrodes 201 and 203. Source electrode 201 acts as the cathode; oxygen vacancies 211 begin to develop where source electrode 201 meets VR layer 202. The reaction near that interface may be, for example, $MeO_2+2xe^- \rightarrow MeO_{2-x}+xO^{2-}$. Inert electrode 203 acts as the anode; the reaction near that interface may be, for example, $2O^{2-} \rightarrow O_2+4e^-$.

In FIG. 2C, the forming operation is being completed and forming voltage pulse 210 is about to end. More oxygen vacancies 211 have been created and/or pushed through the VR layer, constituted into filament 212C—a chain of charge-carriers reaching from the vicinity of source electrode 201 to the vicinity of inert electrode 203. Filament 212C is a path of least resistance for current flowing from source electrode 201 to inert electrode 203; electrons may "hop" between vacancies that are sufficiently close to each other. Electron diffraction and other measurements have revealed room-temperature-conductive Magneli phase compounds localized in some filaments. The presence of complete filament 212C changes the effective resistance of VR layer 202 to its low-resistance state $R_L$. Tunneling electron microscopy (TEM) and other techniques have revealed that partial filaments 213 may also develop during the forming operation.

In FIG. 2D, a reset pulse 220D has been applied to the stack. The illustrated example uses bipolar switching; the reset pulse has a polarity opposite that of the forming pulse and set pulse, so that inert electrode 203 becomes the cathode and source electrode 201 becomes the anode. Because inert electrode 203 does not oxidize easily, the reset pulse did not create more vacancies 211, but instead destroyed or dispersed those vacancies 211 nearest to inert electrode 203. It is believed that filament destruction by the reset pulse in bipolar-switching ReRAM results from a heat-assisted electrochemical reaction. Filament 212C was narrowest at the tip near inert electrode 203; perhaps 3 nm wide or less. A few microamps, when concentrated in such a small area, can create a current density on the order of $10^7$-$10^8$ A/cm$^2$. This is a very intense field that can dissipate a great deal of heat.

Filament 212C is not completely destroyed, however. Instead it has been reduced to a partial filament, somewhat similar to partial filament 213. Electrons can now only hop between vacancies as far as filament break-point 214D. The remaining path between break-point 214D and inert electrode 203 is through substantially vacancy-free, and therefore less conductive, VR material with a local $R \sim R_0$. The high-resistance state $R_H$ of the VR layer depends in part on both $R_0$ and the depth of break-point 214D.

In FIG. 2E, a set pulse 230 has been applied. Set pulse 230 has the same polarity as forming pulse 210, causing source electrode 201 to again function as the cathode. As a result, more vacancies 211 are created and pushed through VR layer 202 until they constitute another filament 212E. Because current can now flow through a completed filament 212E, the VR layer has returned to a low-resistance state $R_L$. Note that set pulse 230 did not need to form filament 212E through the entire thickness of VR layer 202; it only needed to bridge the thinner gap between break-point 214D and inert electrode 203.

In FIG. 2F, a subsequent reset pulse 220F has been applied to the stack. Filament 214D has been reduced to a partial filament with break-point 214F. Ideally, break-point 214F would be at the same location as break-point 214D, but in practice it is often different. This means that each set pulse may have to bridge a gap of a different size to create a filament. There may be some circumstances where a new filament originates from a different place, such as terminus 215 of pre-existing partial filament 213. These break-point variations occur not only from write-cycle to write-cycle in a single ReRAM cell, but from cell to cell in a memory array.

In addition, variation in the location of the filament break-point from cycle to cycle causes a corresponding variation in $R_L$ and $R_H$. This in turn causes a variation in $I(V_{read}, R_L)$ and $I(V_{read}, R_H)$. Too much variation in each of these currents, when added to tolerances in the rest of the device, may result in mistaken readings (e.g., a "0" is read from a cell where a "1" is stored). Referring back to FIG. 1C, the probability of a mistaken reading can be reduced by increasing the magnitude of $V_{read}$, because the curves diverge with increasing magnitude of voltage. However, this means that operation consumes more power, which is undesirable.

Therefore, a need exists for a ReRAM design in which the filament break-point is controllable, predictable, repeatable from cycle to cycle in a single ReRAM cell, and consistent between ReRAM cells in a memory array and from array to array in production. A need also exists for a ReRAM design that can operate with reduced power consumption compared to the current state of the art.

SUMMARY

The following summary presents some concepts in a simplified form as an introduction to the detailed description that follows. It does not necessarily identify key or critical elements and is not intended to reflect a scope of invention.

Embodiments of a ReRAM switching stack include a variable-resistance bi-layer between a pair of electrodes. The bi-layer has a high-ionicity layer and a low-ionicity layer.

The high-ionicity layer is a "high-k" layer with a dielectric constant greater than about 9. It may be crystalline. Its bandgap may be less than about 6 eV. The high-ionicity layer may have a high intrinsic density of charge-carrying defects (e.g., oxygen or nitrogen vacancies). Alternatively, the high-ionicity layer may initially be fabricated with a low density of defects, but be made of a material in which defects can easily be created, or through which defects can easily move (e.g., a material dominated by ionic bonds). The high-ionicity layer may initially be formed with its intended operating lattice structure. Alternatively, the operating lattice structure may develop after a subsequent fabrication step (e.g., annealing, such as the 750 C anneal required for some current-steering elements). Examples of materials for the high-ionicity layer include, but are not limited to, oxides of transition metals such as hafnium oxide ($HfO_x$), zirconium oxide ($ZrO_x$), tantalum oxide ($TaO_x$), titanium oxide ($TiO_x$), vanadium oxide ($V_2O_5$), nickel oxide (NiO), niobium oxide ($Nb_2O_5$), and lanthanum oxide ($LaO_2$).

The low-ionicity layer is a "low-k" layer with a dielectric constant less than about 9 or 10 (in any event, selected to be lower than that of the high-k material selected for the high-ionicity layer). It may be amorphous. Its bandgap may be more than about 6 eV. The low-ionicity layer has a very low density of intrinsic defects, and comprises a material in which defects are difficult to form (e.g., low-ionicity, dominated by covalent bonds). The low-ionicity layer may be ~10-50 Å thick. The low-ionicity layer may comprise a material that remains amorphous after subsequent fabrication steps, such as a 750 C anneal of a current-steering element. Materials for the low-ionicity layer may include oxides, nitrides, and oxynitrides of metalloids or metal-metalloid combinations. Non-limiting examples include silicon oxide ($SiO_x$), aluminum oxide ($AlO_x$), silicon nitride ($SiN_x$), silicon oxynitride ($SiO_xN_y$), hafnium aluminum oxide ($HfAlO_x$), and materials describable as [A][B]N where [A] may be tantalum (Ta), tungsten (W), or molybdenum (Mb) and [B] may be aluminum (Al) or silicon (Si).

In operation, the transition between material properties (e.g., dielectric constant, crystallinity, or lattice structure) at the interface between the low-ionicity layer and the high-ionicity layer may provide a natural break-point for the filament. This break-point may be repeatable for multiple cycles and consistent for multiple cells. Its location is controllable by selecting the location of the interface between the high-ionicity and low-ionicity layers. A forming operation (that is, applying the forming pulse) constitutes a filament through both layers. A reset operation may largely destroy the part of the filament in the low-ionicity layer, but leave the part of the filament in the high-ionicity layer largely undisturbed. A set operation may move vacancies from the high-ionicity layer into the low-ionicity layer to restore the filament.

Embodiments of a ReRAM switching stack include the VR bi-layer between two conductive layers operable as electrodes.

The electrode nearest to the low-ionicity layer ("L-electrode") may be effectively inert: very low in intrinsic defects (such as oxygen or nitrogen vacancies), unsusceptible to defect creation, resistant to defect diffusion, and unlikely to react with other nearby materials. An inert electrode may be made of intrinsically inert material (e.g., platinum (Pt), gold (Au), or iridium (Ir). Alternatively, an inert electrode may be made of an intrinsically non-inert material such as polycrystalline silicon (poly-Si), aluminum (Al) or tantalum nitride (TaN) that is rendered inert by passivation or barrier layers.

If the high-ionicity layer is sufficiently high in intrinsic defects, the electrode nearest to the high-ionicity layer ("H-electrode") may also be inert. Alternatively, the H-electrode may be a source electrode with a high density of intrinsic defects such as oxygen or nitrogen defects (or be highly susceptible to their creation). Non-limiting examples of materials for source electrodes include titanium nitride capped with tungsten (TiN/W), tungsten nitride (WN), laminates of tantalum nitride and titanium nitride (TaN/TiN) and tantalum nitride oxidized to increase defects (TaN(O)). Use of a source electrode may relax the requirement for high defect density or susceptibility in the high-ionicity layer.

Embodiments of the layers of a ReRAM switching stack with a VR bi-layer may be created by a number of methods, including without limitation physical vapor deposition (PVD), chemical vapor deposition (CVD), and atomic layer deposition (ALD). If the H-electrode is to function as a source electrode, its material may be deposited in an oxygen atmosphere or with oxygen precursors to ensure a high density of oxygen vacancies (or similarly with nitrogen for nitrogen vacancies). If the L-electrode layer is created before the low-ionicity VR layer, the low-ionicity VR layer may be grown on the L-electrode by epitaxy or by native oxide formation. Non-limiting examples include a $SiO_x$ low-ionicity layer on a poly-Si L-electrode, an $Al_2O_3$ low-ionicity layer on an Al L-electrode, and a tungsten oxide ($WO_x$) low-ionicity layer on a W L-electrode. These electrode materials are not intrinsically inert, but the oxide growth passivates the electrode and makes them inert, as well as providing the low-ionicity VR layer. Similarly, silicon and aluminum oxides deposited on a tantalum nitride L-electrode can both render the electrode inert and function as the low-ionicity VR layer.

BRIEF DESCRIPTION OF DRAWINGS

FIGS. 4A-4E conceptually illustrate filament behavior in a ReRAM stack with a source electrode, an inert electrode, and a high-ionicity/low-ionicity VR bi-layer.
FIG. 5 conceptually illustrates an embodiment with two inert electrodes and a vacancy-rich high-ionicity VR layer.

DETAILED DESCRIPTION OF EXAMPLE EMBODIMENTS

In embodiments of ReRAM stacks with high-ionicity/low-ionicity VR bi-layers, some of the advantages of high-k and low-k VR materials may be combined and some of their disadvantages may be canceled out. Benefits of some embodiments include (1) a repeatable, consistent, controllable filament break-point at the interface of the high-ionicity and low-ionicity bi-layers (2) low-power operation, and (3) good data retention.

High-k materials (e.g., $HfO_x$, $ZrO_x$, $TaO_x$, $TiO_x$, $V_2O_5$, NiO, $Nb_2O_5$, $LaO_2$) have been used as VR layers in ReRAM cells because they readily exhibit switching behavior; the forming pulse easily creates the vacancies required to constitute a filament. However, the same material properties that make the filament easy to constitute make it difficult to destroy, so that the reset operations consume an undesirably large amount of power. Moreover, the intrinsically high ionicity of high-k materials, and the attendant free motion of charge carriers, can make it difficult for ReRAM cells based wholly on high-k VR layers to retain data.

If the filament break-point inside a high-k single VR layer is not consistent from cycle to cycle or from cell to cell, the set pulse must be strong enough to re-constitute the filament over the longest expected distance from the inert electrode to the break-point, which is overly strong for any of the shorter distances. An overly strong set pulse (or an overly strong forming pulse) can constitute an overly large filament that cannot be sufficiently dispersed or destroyed by the reset pulse; in this case, the cell can no longer be rewritten. In an extreme case, excessive forming current may damage the interface of the high-k VR layer with the inert electrode.

In low-k materials (e.g., $SiO_x$, $AlO_x$, $HfAlO_x$, $SiN_x$, $SiO_xN_y$), the low ionicity, high work function and prevalence of covalent bonds suggests a potential for good data retention. Filaments in low-k materials can be destroyed or dispersed with much less reset power than their high-k counterparts require. However, the initial forming of the filaments can be difficult because these materials, at least as usually encountered, have few to no intrinsic charge-carrying defects (such as oxygen or nitrogen vacancies) and resist their creation and motion. Low-k layers need to be thin (10-50 Å) to be both set and reset at desirably low power levels. However, pairs of electrodes separated only by a 10-50 Å dielectric tend to create unwanted multiple filaments and assorted structural defects.

Figure 1A:
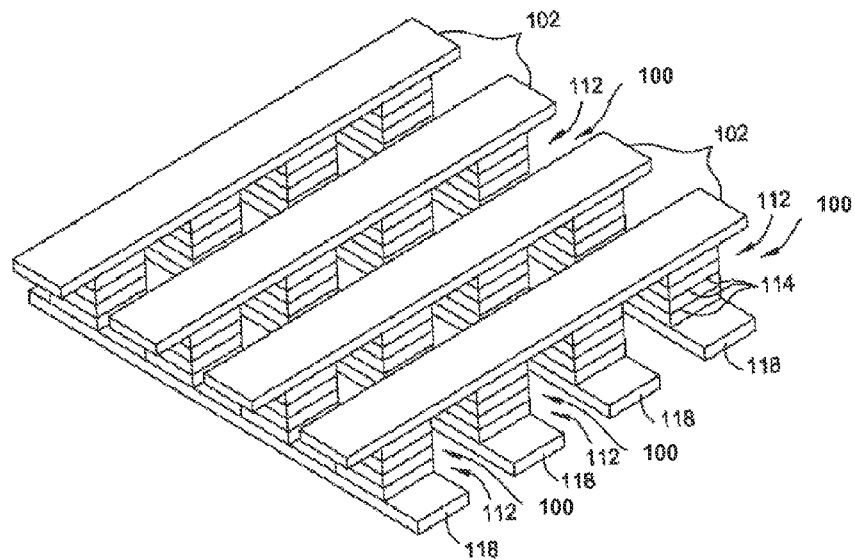
FIG. 1A is a perspective view of an example memory array.
Figure 1B:
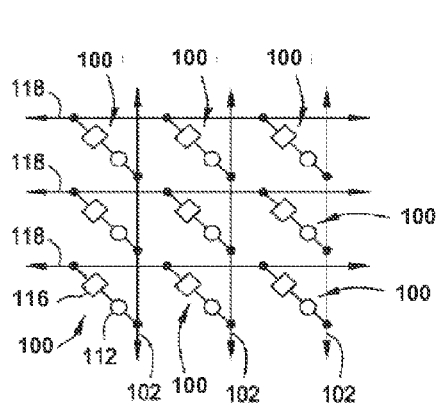
FIG. 1B is a simplified electrical schematic of the example memory array.
Figure 1C:
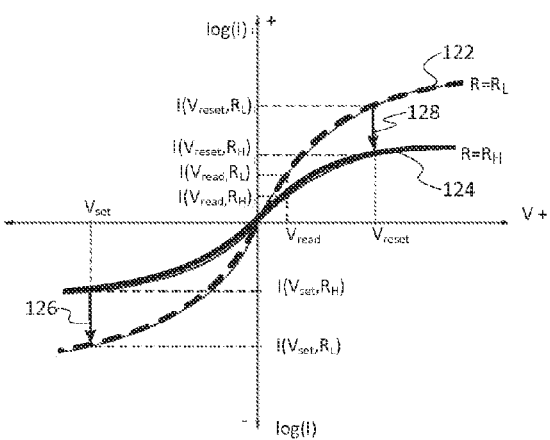
FIG. 1C is an example "I-V curve" of measured current vs. applied voltage for a ReRAM cell.
Figures 2A, 2B, 2C:
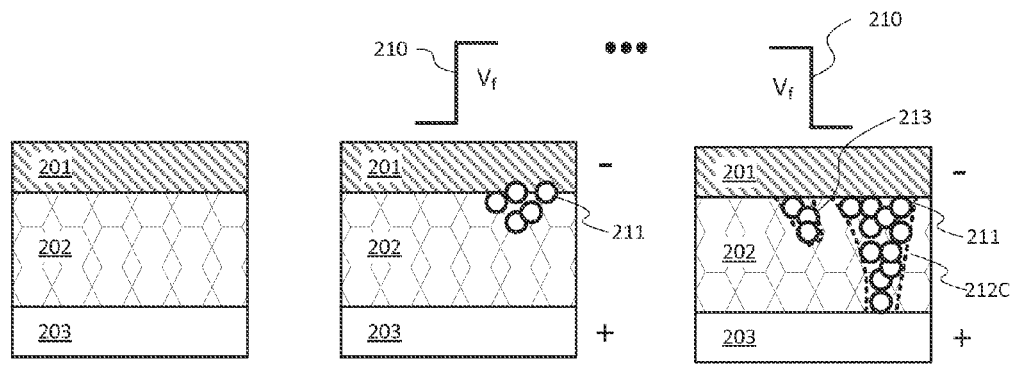
FIGS. 2A-2F conceptually illustrate filament behavior in a simple ReRAM switching stack with a single VR layer.
Figures 2D, 2E, 2F:
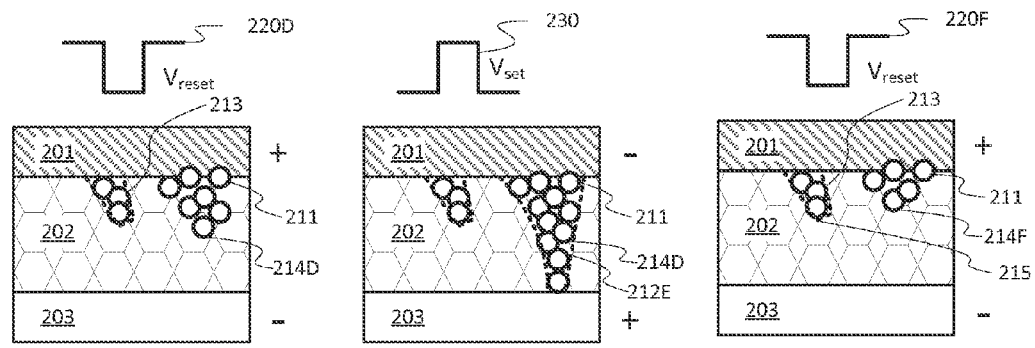
Figures 3A, 3B:
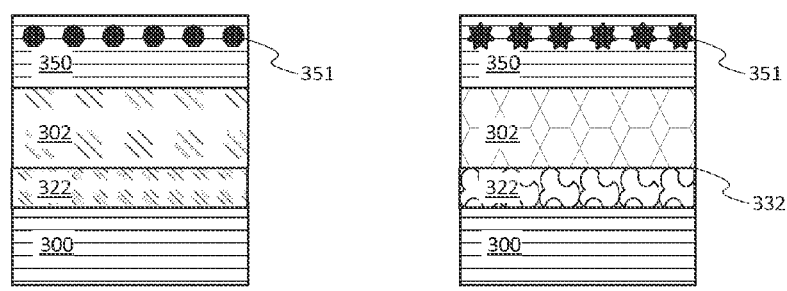
FIGS. 3A and 3B conceptually illustrate the effect of annealing on a crystalline/amorphous VR bi-layer.

FIGS. 3A and 3B conceptually illustrate the effect of annealing on a crystalline/amorphous bi-layer. FIG. 3A represents the stack and surrounding elements before the highest-temperature treatment that follows the creation of the bi-layer in the device fabrication process. Substrate 300 may have multiple other layers including electrodes, barriers, embedded resistors, and the like. Low-k dielectric layer 322 is created (deposited, grown, implanted, etc.) over substrate 300. High-k dielectric layer 302 is created over low-k dielectric layer 322. Alternatively, the order of creating high-k dielectric layer 302 and low-k dielectric layer 322 may be reversed. Overlayers 350 are created over the uppermost of dielectric layers 302 and 322. Overlayers 350 may have multiple other layers including electrodes, barriers, embedded resistors, and the like. Some of the substrate layers, dielectric layers, or overlayers may be shaped, patterned, or textured, or otherwise processed into localized structures.

In some devices, the highest-temperature treatment is the 750 C anneal of the current-steering element to activate one or more dopants. In FIG. 3A, unactivated dopants 351 are included in overlayers 350.

FIG. 3B shows the stack after the highest-temperature treatment. Dopants 351 have been activated. High-k layer 302 has crystallized. Low-k layer 322 is amorphous. Therefore, any current passing through dielectric layers 302 and 322 will encounter a structural discontinuity in the crystalline lattice at bi-layer interface 332, as well as a discontinuity in dielectric constant.

FIGS. 4A-4E conceptually illustrate filament behavior in a ReRAM stack with a source electrode, an inert electrode, and a high-ionicity/low-ionicity VR bi-layer. In FIG. 4A, the stack of source H-electrode 401, VR bi-layer of high-ionicity layer 402 and low-ionicity layer 422, and inert L-electrode 403 is newly fabricated. The illustrated embodiment shows vacancies 411 "pre-loaded" in source H-electrode 401, either by its intrinsic material properties or by processes such as PVD in an oxygen atmosphere or ALD with water and/or ozone precursors. All the fabrication steps are done including any anneals of current-steering elements (not shown), leaving layer 402 crystalline and layer 422 amorphous.

Low-ionicity layer 422 may be proportionally much thinner than in the illustration; yet, due to the presence of high-ionicity layer 402 between low-ionicity layer 422 and source H-electrode 401, the electrodes are far enough apart that multiple filaments and structural damage are unlikely. In this way, high-ionicity layer 402 acts as a buffer for low-ionicity layer 422.

In FIG. 4B, forming pulse 410 is applied. This pulse drives vacancies 411 from source H-electrode 401 into high-ionicity layer 402, which readily accepts them and, depending on the high-ionicity material, may add some of its own vacancies. Because most of the path for filament 412B is through high-ionicity layer 402, the stack takes advantage of the easy filament formation of the high-k material in the high-ionicity layer. The formation of filament 412B slows when it encounters the defect-resistant low-ionicity layer, which acts as a brake to prevent overshoot and possible damage to inert L-electrode 403. The filament may be thinner or more tapered in low-ionicity layer 422 than it would have been in a similar thickness of high-ionicity layer 402 or another layer of a different high-ionicity high-k material.

The division of voltage between high-ionicity layer 402 and low-ionicity layer 422 depends on the layers' relative resistivity. Physical thickness, dielectric constant (k), and the density of vacancies or other defects all influence the relative resistivity. Since low-ionicity layer 422 is selected for low k and low defect density, it has a high effective oxide thickness (EOT) despite its small physical thickness. Therefore, most of the total voltage applied to the stack by forming, set, or reset may be localized to low-ionicity layer 422. Thus the strongest electric field may be concentrated, and the most heat dissipated, in low-ionicity layer 422.

In FIG. 4C, a reset pulse 420C has been applied. The high dielectric constant and/or small number of vacancies in low-ionicity layer 422 confines the electric field and heat from reset pulse 420C to easily destroy that part of the filament, thus taking advantage of the properties of the low-k material in low-ionicity layer 422. Because of the discontinuity at the interface between the low-ionicity and high-ionicity layers, and the greater conductivity of the high-ionicity layer, the reset pulse can apply sufficient field strength and heat to destroy the part of the filament in the low-ionicity layer with little to no effect on the part of the filament in the high-ionicity layer. Therefore, filament break-point 414C naturally occurs at the bi-layer interface 432.

In FIG. 4D, a set pulse 430 has been applied. The set pulse only has to reconstitute the part of the filament in thin low-ionicity layer 422. Thus, high-ionicity layer 402 now acts as a "virtual electrode." The actual switching behavior occurs in low-ionicity layer 422, with the advantages of low operating power and good data retention.

In FIG. 4E, a subsequent reset pulse 420E has been applied. Once again, the filament break-point 414E is located at bi-layer interface 432. This discontinuity in both crystalline structure and dielectric constant at bi-layer interface 432 is a natural break point for the filament after every cycle, in every cell of the array. Therefore, $R_L$ and $R_H$ are much more repeatable than in in stacks with a variable break-point. This repeatability reduces the error margin in read operations.

In some embodiments, the discontinuity in dielectric constant, ionicity, or lattice structure at the bi-layer interface may be sufficient to produce the repeatable break-point and localization of heat and electric field in the low-ionicity layer, even if both layers are crystalline (e.g., with different lattice structures and a discontinuity at the interface), or if both layers are amorphous, or if one or both layers are partially crystallized, or if one layer has a higher crystallinity temperature than the other.

FIG. 5 conceptually illustrates an embodiment with two inert electrodes and a vacancy-rich high-ionicity VR layer. The stack has been fully fabricated, but the forming pulse has not yet been applied. If the high-ionicity VR layer 502 has sufficient intrinsic defects 511 to constitute a filament through low-ionicity layer 522 when a forming (or, later, a set) pulse is applied, the H-electrode 523 may optionally be an inert electrode, similar or identical to L-electrode 503.

The inert electrode(s) may be constructed of a material that is intrinsically inert, such as a noble metal (e.g., Au, Pt, Ir). Alternatively, they may be made of a material that is not intrinsically inert, but becomes inert after a further processing step such as passivation or overcoating with a barrier layer. In some embodiments, the passivation or barrier overcoating may be provided by the creation of the low-ionicity layer of the VR bi-layer.

For example, some native oxides such as silicon oxide ($SiO_x$) and aluminum oxide ($AlO_x$) may have the low k, low intrinsic defect density, and persistent amorphous structure after anneal that may be preferred for the low-ionicity layer of the VR bi-layer. Polycrystalline silicon (poly-Si), aluminum (Al), and tungsten (W) are used as electrode materials but are not intrinsically inert. They become effectively inert, however, when a layer of native oxide grows on the exposed surface. Thus a native oxide that has the desired properties of the low-ionicity layer can perform the functions of that layer as well as enabling the host material to perform the functions of an inert electrode.

Alternatively, a non-native oxide deposited on a non-inert conductive material may both render the conductive material effectively inert and serve as the low-ionicity layer of the VR bi-layer. Non-limiting examples include $SiO_x$ or $AlO_x$ deposited on tantalum nitride (TaN).

One or more intervening layers may be placed between the high-ionicity layer and the low-ionicity layer. The device operation would still have a reliable filament break-point, as long as there was a sufficient discontinuity in crystalline structure or dielectric constant between the high-ionicity layer and the low-ionicity layer.

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A ReRAM stack comprising:
a first conductive layer;
a second conductive layer;
a high-ionicity layer between the first conductive layer and the second conductive layer;
wherein the high-ionicity layer comprises hafnium oxide ($HfO_x$), zirconium oxide ($ZrO_x$), tantalum oxide ($TaO_x$), titanium oxide ($TiO_x$), vanadium oxide ($V_2O_5$), nickel oxide (NiO), niobium oxide ($Nb_2O_5$), and lanthanum oxide ($LaO_2$); and
a low-ionicity layer between the first conductive layer and the second conductive layer;
wherein the low-ionicity layer comprises a material describable as [A][B]N;
wherein [A] comprises tantalum (Ta), tungsten (W), or molybdenum (Mo); and
wherein [B] comprises aluminum (Al) or silicon (Si);
wherein the first conductive layer and the second conductive layer are operable as electrodes; and
wherein the high-ionicity layer has a higher dielectric constant than the low-ionicity layer.

2. The ReRAM stack of claim 1, wherein the high-ionicity layer is crystalline and the low-ionicity layer is amorphous.

3. The ReRAM stack of claim 1, wherein the conductive layer nearest to the low-ionicity layer is effectively inert.

4. The ReRAM stack of claim 1, wherein the conductive layer nearest to the high-ionicity layer acts as a source of vacancies during the forming operation and the set operation.

5. The ReRAM stack of claim 1, wherein the conductive layer nearest to the high-ionicity layer is effectively inert; and wherein the high-ionicity layer acts as a source of vacancies during the forming operation and the set operation.

6. The ReRAM stack of claim 1, wherein the dielectric constant of the high-ionicity layer is greater than about 9; and wherein a dielectric constant of the low-ionicity layer is less than about 10.

7. The ReRAM stack of claim 1, wherein a bandgap of the high-ionicity layer is greater than 6 eV; and wherein a bandgap of the low-ionicity layer is less than 6 eV.

8. The ReRAM stack of claim 1, wherein the low-ionicity layer is between about 10 Å and 50 Å thick.

9. The ReRAM stack of claim 1, wherein the low-ionicity layer is amorphous and the high-ionicity layer is crystalline after a 750 C anneal.

10. The ReRAM stack of claim 1, wherein the second conductive layer comprises a native oxide sub-layer directly interfacing the low-ionicity layer.

11. The ReRAM stack of claim 1, further comprising a barrier layer disposed between the second conductive layer and the low-ionicity layer, wherein the barrier layer prevents migration of vacancies between the second conductive layer and the low-ionicity layer.

12. The ReRAM stack of claim 11, wherein the second conductive layer comprises tantalum nitride, and wherein the barrier layer comprises at least one of silicon oxide or aluminum oxide.

13. The ReRAM stack of claim 1, further comprising an intervening layer disposed between the high-ionicity layer and the low-ionicity layer.

14. The ReRAM stack of claim 1, wherein [A] comprises tantalum (Ta).

15. The ReRAM stack of claim 1, wherein [A] comprises tungsten (W).

16. The ReRAM stack of claim 1, wherein [A] comprises molybdenum (Mo).

* * * * *